(12) United States Patent
Iguchi et al.

(10) Patent No.: US 6,683,326 B2
(45) Date of Patent: Jan. 27, 2004

(54) SEMICONDUCTOR PHOTODIODE AND AN OPTICAL RECEIVER

(75) Inventors: Yasuhiro Iguchi, Itami (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 39 days.

(21) Appl. No.: 09/986,366

(22) Filed: Nov. 8, 2001

(65) Prior Publication Data

US 2002/0056845 A1 May 16, 2002

(30) Foreign Application Priority Data

Nov. 14, 2000 (JP) ........................................ 2000-346869

(51) Int. Cl.[7] .............................................. H01L 27/15
(52) U.S. Cl. .................... 257/82; 257/460; 257/461; 257/90; 257/450
(58) Field of Search ................................ ; H01L 27/15

(56) References Cited

U.S. PATENT DOCUMENTS

| | | | |
|---|---|---|---|
| 3,881,113 A | * | 4/1975 | Rideout et al. ............. 250/551 |
| 5,365,101 A | | 11/1994 | Tonai |
| 5,557,117 A | * | 9/1996 | Matsuoka et al. .......... 257/184 |
| 6,148,016 A | * | 11/2000 | Hegblom et al. |
| 6,303,941 B1 | * | 10/2001 | Xie et al. .................... 257/25 |
| 6,313,483 B1 | * | 11/2001 | Ogihara et al. .............. 257/79 |

FOREIGN PATENT DOCUMENTS

| | | |
|---|---|---|
| DE | 35 43 558 A1 | 6/1987 |
| DE | 35 43 558 C2 | 6/1987 |
| EP | 0 675 549 A1 | 10/1995 |
| JP | 404213876 A | * 8/1992 |

OTHER PUBLICATIONS

European Search Report issued for corresponding European Application No. EP 01 12 7053.

M. Makiuchi et al. "Monolithic GaInAs Quad–p–i–n Photodiodes for Polarization–Diversity Optical Receivers" *IEEE Photonics Technology Letters* vol. 3, No. 6, Jun. 1991, pp. 535–536.

H. Fukano et al. "High–Responsivity and Low–Operation–Voltage Edge–Illuminated Refracting–Facet Photodiodes with Large Alignment Tolerance for Single–Mode Fiber" *Journal of Lightwave Technology* vol. 15, No. 5, May 1997, pp. 894–899.

* cited by examiner

*Primary Examiner*—Wael Fahmy
*Assistant Examiner*—Dana Farahani
(74) *Attorney, Agent, or Firm*—Smith, Gambrell & Russell, LLP

(57) ABSTRACT

The present invention relates to a high-sensitivity top-electrode and bottom-illuminated type photodiode. The device consists of a highly doped buffer layer, a photo-detecting layer on a semi-insulating substrate. An electrode is formed on the conductive domain that is formed in the photo-detecting layer, and another electrode is formed on the partly exposed peripheral area of the highly-doped buffer layer by removing a part of the photo-detecting layer. As the semi-insulating substrate absorbs less light in the substrate, a decrease of sensitivity by the substrate absorption can be prevented.

19 Claims, 7 Drawing Sheets

Comparative Example

Comparative Example

SEMICONDUCTOR PHOTODIODE AND AN OPTICAL RECEIVER

BACKGROUND OF THE INVENTION

1. Field of the Invention

The present invention relates to a semiconductor photodiode mainly used for optical communications. (Hereafter a semiconductor photodiode is referred to as a "PD".) Particularly the present invention relates to a surface-mounting type PD in which signal light enters from a bottom surface of the PD, and an optical receiver using such PD.

2. Definitions

In this specification and claims, the terms of "top surface", "bottom surface" and "side surface" of a PD are defined as follows:

The "top surface" of PD means the top surface of a laminated layer farthest from a substrate.

The "bottom surface" of a PD usually means the bottom surface of substrate. Some semiconductor PDs have a few layers laminated on the bottom surface of its substrate. For example, in the case that a metallized layer for contact is formed on the bottom surface of a substrate, the bottom surface of a PD means the metallized surface, and not the bottom surface of the substrate itself.

The surface-mounting type PDs are classified into three types in accordance with the direction of light incident thereon: a top-incidence type, in which light enters from the top surface, a bottom-incidence type, in which light enters from the bottom surface, and a sidle-incidence type, in which light enters from the side surface.

The device in which the light enters from the top surface is referred to as an "Top-illuminated PD". The device in which the light enters from the bottom surface is referred to as a "Bottom-illuminated PD". The device in which the light enters from the side surface is referred to as a "Side-illuminated PD".

3. Description of the Background Art

In order to meet the development of optical communications high-sensitivity and easy handling PDs have been required. As the first conventional example, FIG. 1 shows a surface-mounting type Bottom-illuminated PD that was proposed in German Patent No. DE 35 43 558 C2 (Ref. No. 1). As a p-electrode is formed directly on the top surface of a Bottom-illuminated PD, it enables the diameter of the light receiving area to be small, and the shape of the p-electrode need not be a ring-type. While maintaining an area sufficient to receive light, the capacitance of a pn-junction can be made small, and thereby a high-sensitivity and high-speed-responsivity device can be obtained. In addition, such Bottom-illuminated PD is the most suitable to apply the surface-mount technologies because the light enters from a bottom surface. In other words, it is possible to structure such that is fixed facing upward at the end of a V-groove so as to receive the light from the bottom surface.

A Bottom-illuminated PD 1 includes a wide n-type portion 2 and a narrow p-type domain 3. An interface between the n-type portion 2 and the p-type domain 3 is a pn-junction 4. The n-type portion 2 includes an n-type substrate and an n-type epitaxial layer. A p-electrode having no aperture is formed on the p-type domain 3. A ring-shaped n-electrode is formed on the bottom surface of the substrate. An Si-substrate 5 is a rectangular plate to be used for making a SM device. A V-groove 6 is formed along a center axial line of the substrate 5. The V-groove 6 can be formed by the anisotropy-etching method. An optical fiber 7 is laid on the V-groove 6, and then the fiber is fixed thereon. The ring-shaped n-electrode of the Bottom-illuminated PD is formed on the Si-substrate 5. A p-electrode in a top surface 9 is connected to preamplifiers by wire bonding, that is not illustrated in FIG. 1.

An incident light 8 that is emitted from the optical fiber 7 and travels along the V-groove 6, is reflected at a mirror 11, and after passing through the ring-shaped n-electrode, the light 8 enters from a bottom surface 10 in the n-type portion 2 and progresses to the pn-junction 4, where the light 8 generates photocurrent at the pn-junction.

The second conventional example is shown in FIG. 2, that is a cross-sectional view of a p-i-n-PD, having an InGaAs photo-detecting layer, which has been frequently used in recent optical communications. (Ref. No. 2: U.S. Pat. No. 5,365,101) An n-InP buffer layer 13, an n-InGaAs photo-detecting layer 14 and an n-InP window layer 15 are epitaxially grown in this order on an n-InP substrate 12. A window layer used in this specification and claims is also called a cap layer in this field. P-type dopants are diffused from the top surface of the window layer 15 to the central and peripheral areas thereof to form a p-type domain 3 and a shield domain 16. Interfaces between p-type domains and an n-type domain are pn-junctions 4. A passivation film 17 is formed on a top surface in order to protect the pn-junctions 4. A p-electrode 19 having no aperture is formed on the center of the p-type domain 3. A ring-shaped n-electrode 18 is formed on a bottom surface of the n-InP substrate 12. As this is the Bottom-illuminated PD, it has an aperture part for receiving the incident light 8 in the center of the bottom surface of the InP substrate 12.

The conventional Bottom-illuminated PDs shown in FIGS. 1 and 2 have an n-type InP substrate that is not always good for transmittance from the standpoint of light transmission through the substrate.

Higher transmittance of the n-InP substrate is necessary to improve the sensitivity of the Bottom-illuminated PD.

An InP substrate containing $3 \times 10^{18}$ cm$^{-3}$ to $10 \times 10^{18}$ cm$^{-3}$ of tin (Sn) or sulfur (S) has been generally used as an n-type substrate. However, such substrate absorbs from 10% to 20% light. Large amounts of these n-type dopants must be doped into the substrate to raise the resistivity of the n-type substrate. The increase in the absorption by n-type dopants results in the increased absorption in the substrate. If the sulfur density is lowered to $1 \times 10^{18}$ cm$^{-3}$, the transmittance of the substrate can be considerably improved, but there are drawbacks such as an increase in the resistivity of the substrate, or an increase in the crystal-defect.

FIG. 3 is a diagram showing the relationship between transmittance and wavelength in the case of an S-doped n-InP and an iron (Fe)-doped semi-insulated (SI)-InP substrates, each having a thicknesses of 350 µm. The abscissa axis is the wavelength (nm), and the ordinate axis is the transmittance.

Sulfur is an n-type dopant in this case. The more dopants are contained, the more light is absorbed. This is because light absorption is caused mainly by the dopants. The longer the wavelength, the less the absorption becomes. However, when the sulfur density decreases, the minimum absorption wavelength moves to about 1.3 µm.

For example, in the case of carrier density of $6.5 \times 10^{18}$ cm$^{-3}$, transmittance is about 0.75 at a 1.3 µm optical wavelength. In the case of carrier density of $3.3 \times 10^{18}$ cm$^{-3}$, transmittance is about 0.87 at the same wavelength. In the case of carrier density of $1.0 \times 10^8$ cm$^{-3}$, transmittance becomes 0.96. In other words, optical absorption still remains 0.04 in this case. On the other hand, in the case of carrier density of $1.0 \times 10^{18}$ cm$^{-3}$ Fe-doping, transmittance is 0.98 and absorption can be reduced to 0.02 at the same wavelength.

Conventionally low resistance n-type or p-type substrates have been used for PDs of the Si-series, GaAs-series or InP-series. As an electrode has been formed on a bottom surface of the substrate, the photocurrent has had to pass through the substrate. If the substrate has high resistance, photocurrent can not flow easily and response speed becomes slow. Therefore, the substrates have been made of low-resistivity p-type or n-type crystals.

On the other hand, Fe makes a deep energy level in a forbidden band in the InP crystal. As the deep energy level captures electrons, the movable electron density is decreased. So, an Fe-doped InP crystal becomes highly resistant. In other words, the Fe-doped substrate has insulating or semi-insulating property. An electrode therefore cannot be formed on a bottom surface of the Fe-doped substrate. This is the reason why an Fe-doped substrate has been rarely used for a PD substrate.

M. Makiuchi, H. Hamaguchi, O. Wada, and T. Mikawa, published "Monolithic GaInAs Quad-p-i-n Photodiodes for Polarization-Diversity Optical Receivers", IEEE PHOTONICS TECHNOLOGY LETTERS, VOL. 3, NO. 6, JUNE 1991, p535–536 (Ref. No. 3) for an example of a Bottom-illuminated PD. However this type of device has not been used practically so far because of its problems in terms of production and quality.

As the third conventional example, a Side-illuminated PD is shown here, although it was proposed for an object which is different from that of the present invention.

FIG. 4 shows an oblique view of the Side-illuminated PD (Ref. No. 4: Hideki Fukano, Atsuo Kozen, Kazutoshi Kato, and Osaake Nakajima, "High-Responsivity and Low-Operation-Voltage Edge-Illuminated Refracting-Facet Photodiodes with Large Alignment Tolerance for Single-Mode Fiber", JOURNAL OF LIGHTWAVE TECHNOLOGY, VOL. 15, NO. 5, MAY 1997, p894–896).

This PD's layer-structure from the lowest layer is:

an SI-InP substrate 170, an $n^+$-InP buffer layer 171, an $n^+$-InP contact layer 172, an $n^-$-InGaAs layer 173, an n-InP layer 174, a $p^+$-InP layer 175, a p-electrode 176, and an n-electrode 177 (The n-electrode 177 is placed on the InP contact layer 172).

This PD shows a dissymmetric tip-shaped PD. The n-electrode 177 is formed on the InP contact layer 172 that is exposed, with a portion of the n-InP layer 174 and the n-InGaAs layer 173 being removed by etching. A rectangular part of the n-InP layer 174 becomes the p-InP layer 175 by means of zinc (Zn) diffusion. The p-electrode 176 is formed on the p-InP layer 175. A side surface of the substrate becomes a downward slant surface 179. A light 178 enters into the slant surface 179 horizontally. The light, after being refracted upward at the side surface, reaches a pn-junction as a refraction light 180. This is a Side-illuminated PD. The light enters into the neighboring pn-junction of the photo-detecting layer by being refracted upward at the side surface of a layer beneath the photo-detecting layer. This PD is different from the present invention in that light enters the side surface of PD. And this PD is not a Bottom-illuminated PD, but rather a top-surface-electrode type PD. As the structure is complicated, there are many problems such as cost to be solved. This type of PD is defined as a "top-electrode" PD in order to distinguish it from a conventional top or bottom surface-mounting type PD that has an electrode on the top or bottom surface of the PD, respectively.

SUMMARY OF THE INVENTION

The present invention relates to a high-performance Bottom-illuminated PD having following structures, which is the most suitable for applying surface-mount technologies, and also relates to an optical receiver using such PD. A PD according to one embodiment of the present invention comprises an insulating or an SI-substrate, such as an Fe-doped InP single crystal, a highly doped n-type buffer layer, a less-doped photo-detecting layer and a window layer, one laminated on another in the enumerated order, and a conductive domain formed in the central part of the top layer, a p-electrode formed on the conductive domain, and an n-electrode formed on the buffer layer being exposed by etching.

That is, the present invention is characterized in that the n-electrode is laid on the partly exposed buffer layer. The buffer layer is a thin film layer grown on the SI-substrate, being interposed between the substrate and the photo-detecting layer in order to improve the crystal matching with the photo-detecting layer. As the photocurrent flows in this layer, the layer is low resistive, namely, highly doped. In the case where an Fe-doped n-InP single crystal is used for the substrate, the buffer layer is a highly-doped InP film. A part of the upper layers, such as a photo-detecting layer and a window layer, are removed for exposing a part of the buffer layer in order to form an n-electrode onto the exposed buffer layer.

A Bottom-illuminated PD according to one embodiment of the present invention relates is characterized by the following structures:

1. A substrate is made of crystal having high transmittance property, such as SI Fe-doped InP single-crystal.
2. A part of the upper layers including the photo-detecting layer, etc. are removed so that a part of the buffer layer is exposed.
3. An n-electrode is formed on the exposed buffer layer.

In this summary and the following description in this specification, the SI substrate is mainly described as a substrate of the present invention, however, the insulating substrate is also applicable as a substrate of the present invention.

DETAIL DESCRIPTION OF THE INVENTION

The inventors tried to develop a highly reliable Bottom-illuminated and surface-mounting type PD suitable for high-speed transmission systems using an Fe-doped substrate considering transparency of an Fe-doped crystal.

Since the substrate is semi-insulating, photocurrents cannot flow through the substrate. In other words, it is impossible to form an n-electrode on a bottom surface of the substrate as in the conventional PDs. Then the inventors tried to form an n-type and a p-type epitaxial layers on an Fe-doped substrate, and also to form an n-electrode on the Fe-doped substrate. Both of the p- and n-electrodes could be formed on the top surface of PD having the Fe-doped substrate. It gave an advantage for production and product performance.

Figure 2:
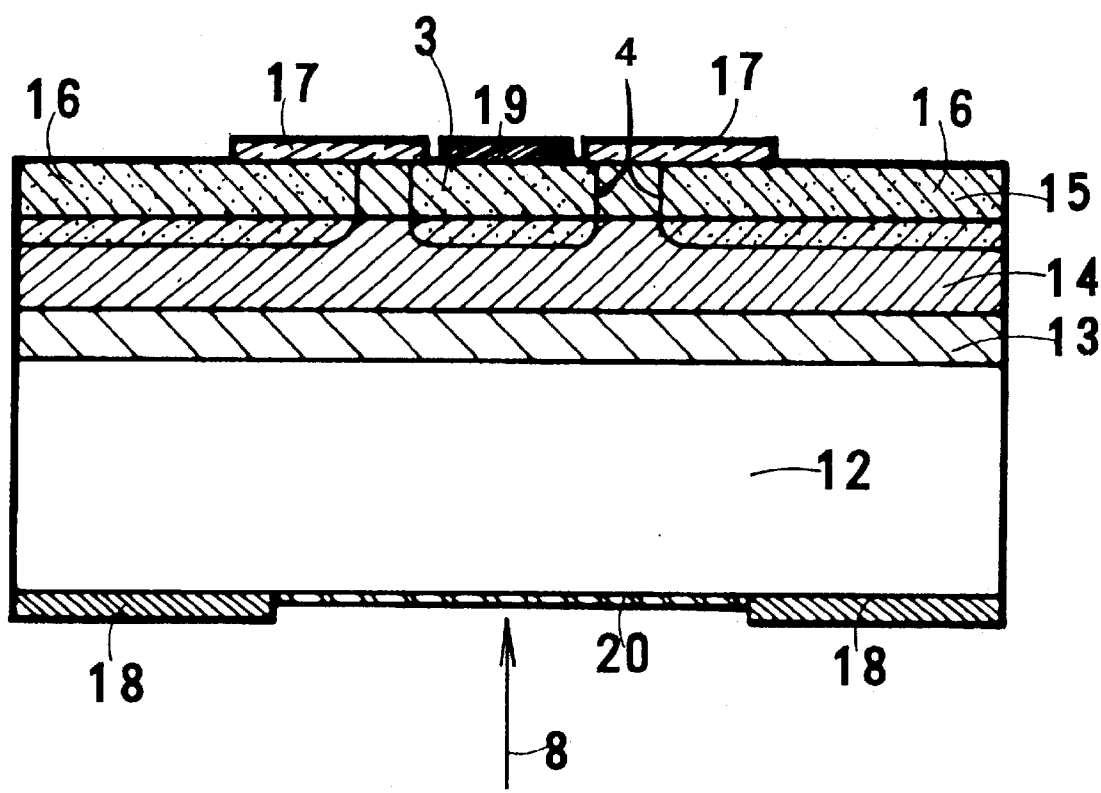
FIG. 2 is a longitudinal cross-sectional view of a conventional planar-type Bottom-illuminated PD having an $n^+$-InP crystal substrate.
Figure 3:
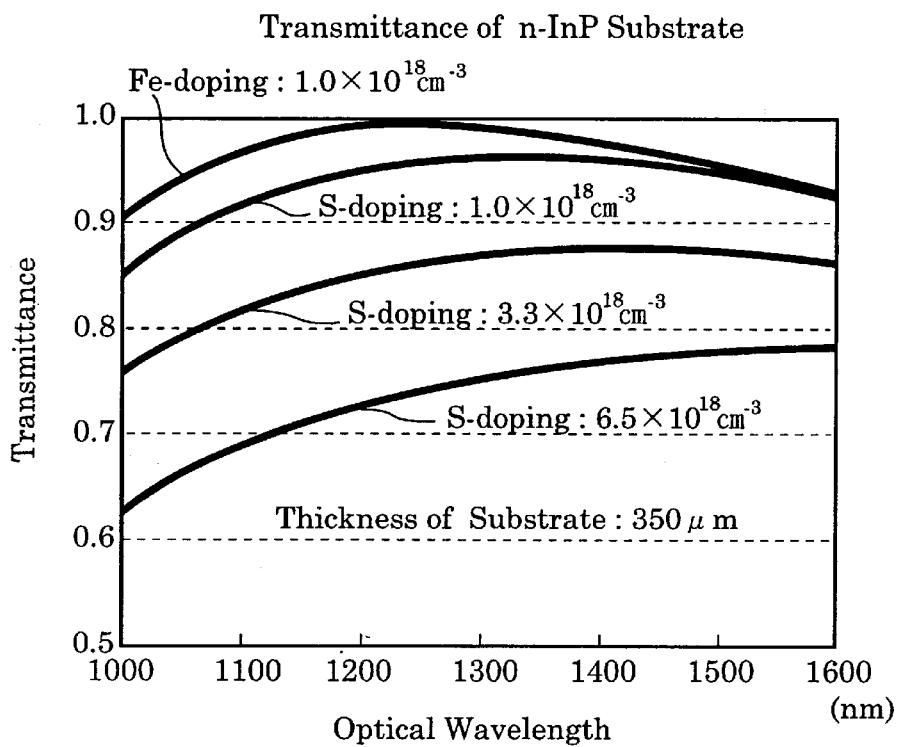
FIG. 3 is a graph showing the relationship between transmission coefficient and wavelength in the cases of S-doped n-InP substrates and an Fe-doped SI-InP substrate, each having a thickness of 350 μm.
Figure 4:
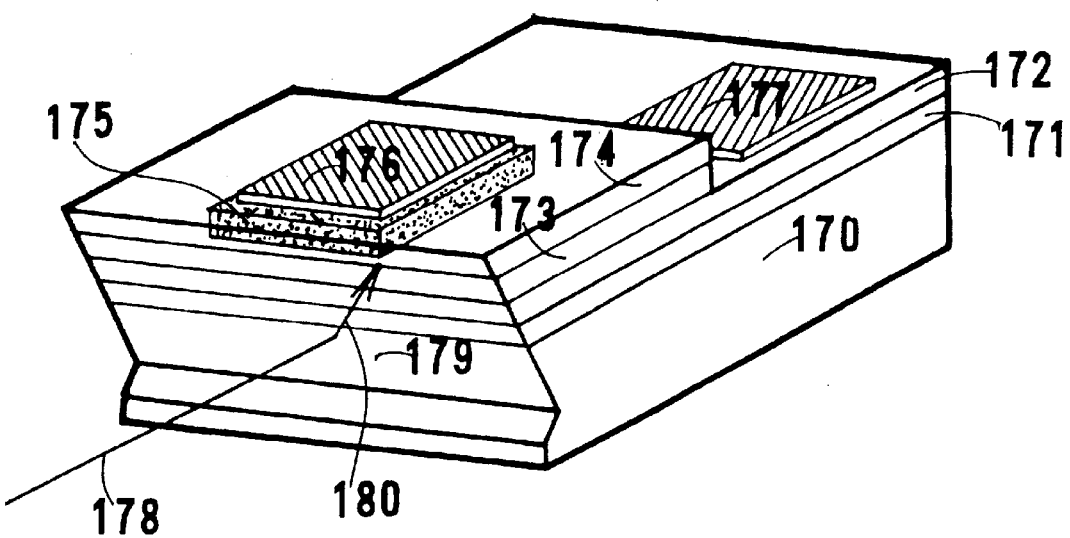
FIG. 4 is an oblique view of a conventional SI-InP PD receiving the light from a slant side surface of the PD referred to as the Conventional Example 3.
Figure 5:
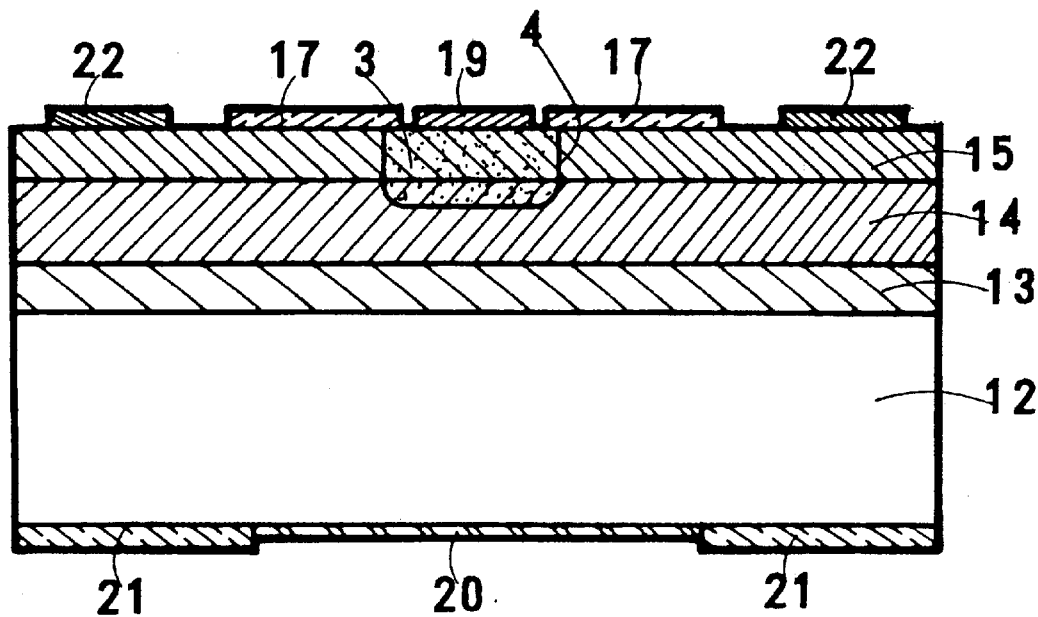
FIG. 5 is a longitudinal cross-sectional view of Comparative Example 1 of a top-electrode PD.
Figure 6:
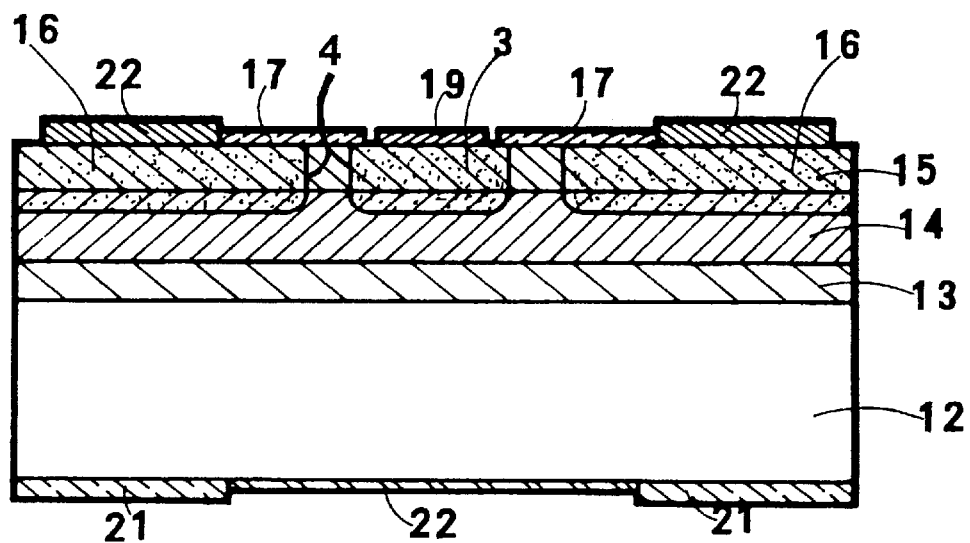
FIG. 6 is a longitudinal cross-sectional view of Comparative Example 2 of a top-electrode PD.

The inventors modified the conventional example whose electrodes had been formed on the top and bottom surfaces as shown in FIG. 2 to a top-electrode type PD. The modified comparative examples are shown in FIGS. 5 and 6. These PDs are advantageous to make rectangular-shaped ones.

Comparative Example 1

FIG. 5 is a longitudinal cross-sectional view of Comparative Example 1 that is a top-electrode PD studied by the inventors. A highly doped n-InP buffer layer 13, a less-doped n-InGaAs photo-detecting layer 14 and a less-doped n-InP window layer 15 were formed on a highly doped n-InP substrate 12 by epitaxially growing. A p-type domain 3 was formed in the center of the epitaxial layers 14 and 15 by Zn diffusion etc. A p-electrode 19 was formed on the p-type domain 3. A pn-junction 4 was protected by an SiN passivation film 17. A ring-shaped metallized layer 21 was formed on the bottom surface of the n-InP substrate 12. An AR coating film 20 was formed on an aperture in the bottom surface. These structures are similar to the conventional example shown in FIG. 2 so far. In addition an n-electrode 22 was formed on a peripheral area in a top surface of the less doped n-InP window layer 15.

The metalized layer 21 laid on the bottom surface was for soldering with a wiring pattern and not for an n-electrode. Therefore, electrical voltages were applied between the p-electrode 19 and the n-electrode 22. However, it did not work by this method. The n-electrode becomes a low contact-resistance electrode only when it is used with the highly doped n-InP materials. The window layer 15 is n-type, but its carrier density is low. When an n-electrode was formed on a window layer having such low carrier density, contact resistance of the n-electrode became so high. Therefore, it turned out that this PD cannot be used for high-speed transmission systems.

Comparative Example 2

FIG. 6 is a longitudinal cross-sectional view of Comparative Example 2 of a top-electrode PD studied by the inventor.

This PD consisted of an n-InP buffer layer 13, an n-InGaAs photo-detecting layer 14 and an n-InP window layer 15 formed in sequence on a highly doped n$^+$-InP substrate 12; and p-type domains were formed both in the center and a peripheral part of the top surface; and further a p-electrode 19, and an n-electrode 22 was formed on the central area of p-type domain 3 and the peripheral area of p-type domain 16, respectively. In order to distinguish the p-type domain, the p-type domain in the peripheral area 16 is referred to as a "shield domain" 16, and the p-type domain 3 in the central area is referred to as a "conductive domain" 3. The shield domain 16 is effective to prevent tail-shaped signals due to the delay to be caused by the light incident in the peripheral area of the photo-detecting layer. Interfaces between p-type domains (a conductive domain and a shield domain) and an n-type domain are pn-junctions 4. As a ring-shaped metallized layer 21 and an AR-coating film 22 in the bottom surface of the PD are same as those in Comparative Example 1.

The difference of this PD compared with Comparative Example 1 shown in FIG. 5 is that an n-electrode was formed on a p-type shield domain. This PD was more difficult to develop. As an n-electrode had been formed on a p-type domain, the structure of a semiconductor layer between a p- and an n-electrodes became p-n-n-p. The PD can be operated by applying minus voltage to a p-electrode and plus voltage to an n-electrode (reverse bias). However, as the electrical circuit between the shield domain 16 and an n-InGaAs photo-detecting layer 14 became a forward-direction circuit, and so a forward-direction voltage-drop of 0.6 to 0.8 V occurred. Then the PD could not operate at low voltage because the most of power-source voltage had been lost by the forward-direction voltage-drop. This is also unsuitable for high-speed response operation. Thus, this type PD is inadequate for a photodiode for optical communications which must be used essentially at low voltage and high speed.

For developing a high-sensitivity Bottom-illuminated PD, optimization of an n-electrode is a big technical problem to be solved as described above.

PREFERRED EMBODIMENT OF THE INVENTION

EXAMPLE 1

Figure 7:
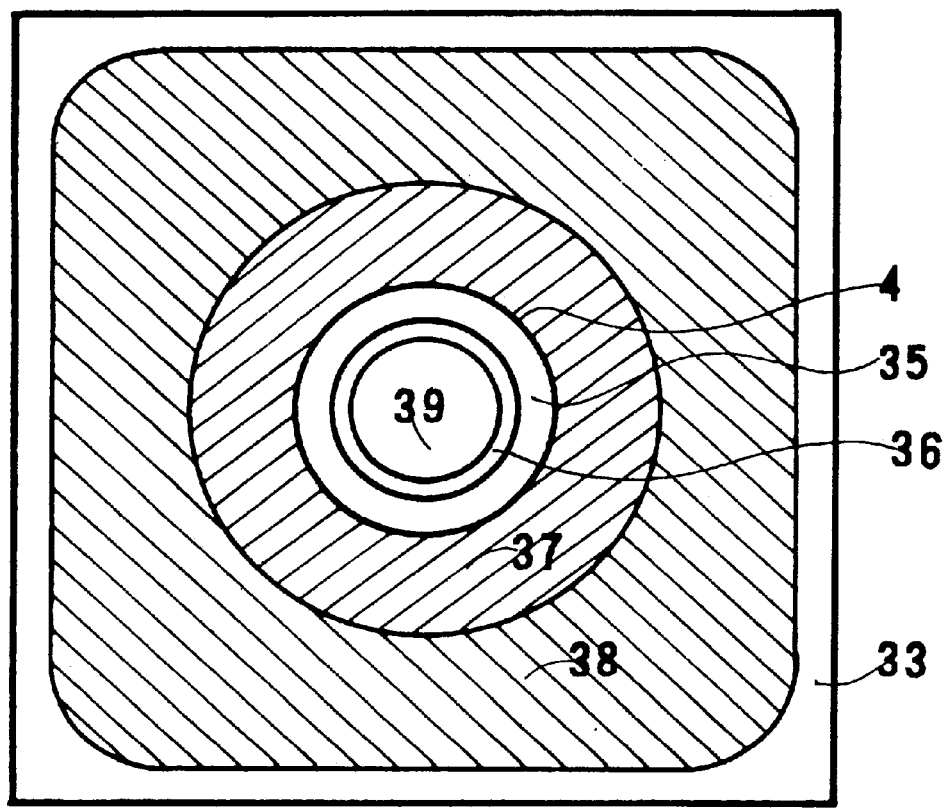
FIG. 7 is a plan view of Example 1 of the present invention.
Figure 8:
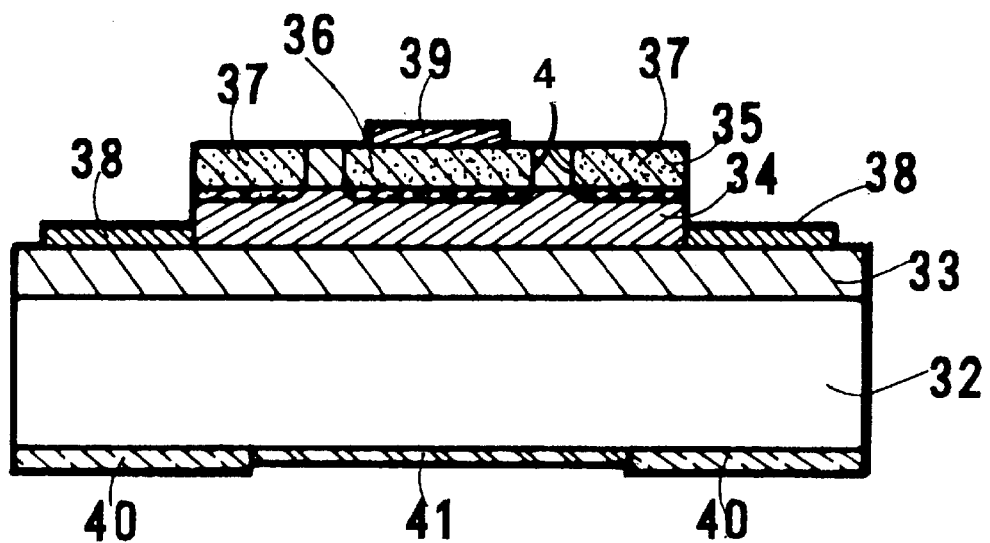
FIG. 8 is a longitudinal cross-sectional view of Example 1 of the present invention.

The first example of the present invention is shown in FIGS. 7 and 8.

FIG. 7 is a plan-view of Example 1, and it does not indicate a cross section. Hatching is added in order to distinguish a ring-shaped n-electrode 38 and a shield domain 37 from a pn-junction 4, a highly doped buffer layer 33, a window layer 35 and a p-type electrode 39.

FIG. 8 shows its longitudinal cross-sectional view.

A $10^{18}$ cm$^{-3}$ S-doped n$^+$-InP layer 33, as a low-resistivity buffer layer, was grown to a thickness of 4 μm by chloride VPE, on a $10^{18}$ cm$^{-3}$ Fe-doped InP substrate 32 (SI-InP substrate; d=300 μm), both surfaces of which had been polished. Then, as a photo-detecting layer, a $10^{15}$ cm$^{-3}$ S-doped n-InGaAs layer 34 was grown to a 4 μm thickness onto the n$^+$-InP layer 33, and, as a window layer, an n-InP layer 35 ($10^{15}$ cm$^{-3}$) was grown to a thickness of 2 μm thereupon.

This window layer 35 can provide a highly reliable and low dark-current photodiode by means of the passivation of a pn-junction in a wide range of band-gap.

Then, a p-type domain 36 was formed by adding Zn-dopants of 3 to 10×$10^{18}$ cm$^{-3}$ to the n-type domain (the window layer 35 and the photo-detecting layer 34) through an SiN patterned film (mask) having an aperture of a 100 μm diameter, and by diffusing them to the photo-detecting layer. Two pn-junctions 4 were formed between two p-domains and an n-type domain. One p-type domain may be formed only in the central area. Or Zn diffusion may be done both in the central and peripheral areas, simultaneously. The p-type domain in the peripheral area is referred to as a "shield domain" 37, and the p-type domain 36 in the central area is referred to as a "conductive domain" 36 in the same manner as in Comparative Example 2.

A part of the peripheral area of the shield domain 37 was removed by etching to the depth to expose the highly doped n⁺-InP buffer layer 33. This device became a mesa-type device having a concentric ridge and peripheral low land. An n-electrode 38 was formed by vapor deposition or sputtering such electrode materials, such as gold-germanium-nickel (AuGeNi), onto the exposed surface of the n⁺-InP buffer layer 33.

On the other hand, a p-electrode was formed on the surface of central photo-detecting area (the conductive domain 36) by vapor deposition of gold (Au) or titanium (Ti) for a p-electrode. Thus, a p-electrode 39 was formed as described above. As the n-InP buffer-layer 33 is of low resistance, if a reverse bias voltage is applied between a p- and an n-electrodes, most of the reverse voltage is loaded on the pn-junction. In other words, the generation of the reverse bias voltage is the same as the conventional PD having an n-electrode formed at the bottom of the substrate.

A metallized film 40 having an aperture that is sufficiently larger than the diameter of a light beam was formed on a bottom surface of the Fe-doped InP substrate 32. The metallized film 40 was used for soldering the substrate, not for an n-electrode.

An SiON film as an AR-coating film 41 was formed in the central aperture area of the bottom surface. Because this PD is a bottom-illuminated PD, light incident on the bottom surface would become a loss if it were reflected there. The AR-coating film 41 was prepared in order to reduce the reflection of light at the bottom surface.

Figure 1:
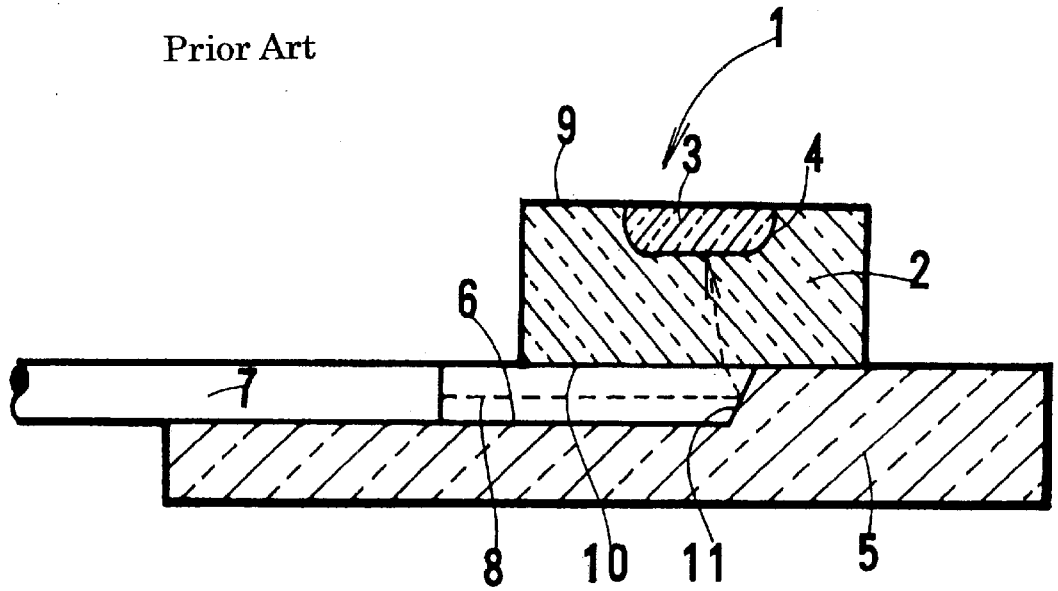
FIG. 1 is a longitudinal cross-sectional view of a conventional surface-mounting type Bottom-illuminated PD module.

The metallized film 40 can be omitted. If the metallized film 40 is omitted, the PD can be easily fixed with conductive adhesives, such as silver (Ag) paste. The p-electrode 39 and the n-electrode 38 are connected with the wiring of packages and/or leads by using Au wires. This type of PD can be mounted on any kind of packages. The PD can be applied for both popular metal-can packages and surface-mounting type Si-substrates as shown in FIG. 1. At that time, the PD was assembled to a surface-mounting type module in order to examine its performance.

The PD was operated with the same constituents of FIG. 1. A conventional PD having a $3.3 \times 10^{18}$ cm⁻³ S-doped n⁺-InP substrate had a sensitivity of 0.80 A/W at a 13 μm wavelength, but the PD of this invention having the Fe-doped SI-InP had a sensitivity of 0.90 A/W under the same conditions. Sensitivity was upgraded by about 10%. The reason for this is that the absorption of signal light by the substrate was less. Increase of sensitivity shows a prominent effect to improve the reliability of a receiver by increasing the S/N ratio.

Forward-direction voltage-drop representing device resistance was 0.75 V at 50 mA flowing of forward-direction electrical current in the conventional PD whose electrodes were formed on the top and bottom surfaces.

In Comparative Example 1 having the n-electrode 22 on the window layer 15 of a top surface, the forward-direction voltage-drop became 2V at 50 mA This is because the electric current must pass through the layers of the p-type domain, the photo-detecting layer, the buffer layer and the substrate; and return to pass the same substrate, buffer layer, photo-detecting layer and window layer in that order. The resistance of no Zn-doped photo-detecting layer is especially high so the electric current is limited to flow, then the forward-direction voltage-drop has been increased.

In Example 1, however, the forward-direction voltage-drop achieved 0.75V at 50 mA, which is the same value as in the conventional PD whose electrodes had been formed on its top and bottom surfaces. As an n-electrode had been formed on the buffer layer, there occurred a less voltage drop in the photo-detecting layer and the window layer, especially in the photo-detecting layer. Due to the less forward-direction voltage-drop and less resistance, the PD of the present invention showed a high-speed response performance. Even in the case of applying a reverse bias voltage as small as 2 V, cut-off frequency was 1.5 GHz.

The following combination can be freely applied in this Example:

the carrier density of an Fe-doped InP substrate is not less than $10^{16}$ and not more than $10^{19}$ cm⁻³, the carrier density of a buffer layer is not less than $10^{17}$ and not more than $10^{19}$ cm⁻³, the carrier density of a photo-detecting layer is not exceeding $5 \times 10^{15}$ cm⁻³, and the carrier density of a window layer is not less than $1 \times 10^{15}$ and not more than $5 \times 10^{15}$ cm⁻³.

EXAMPLE 2

Figure 9:
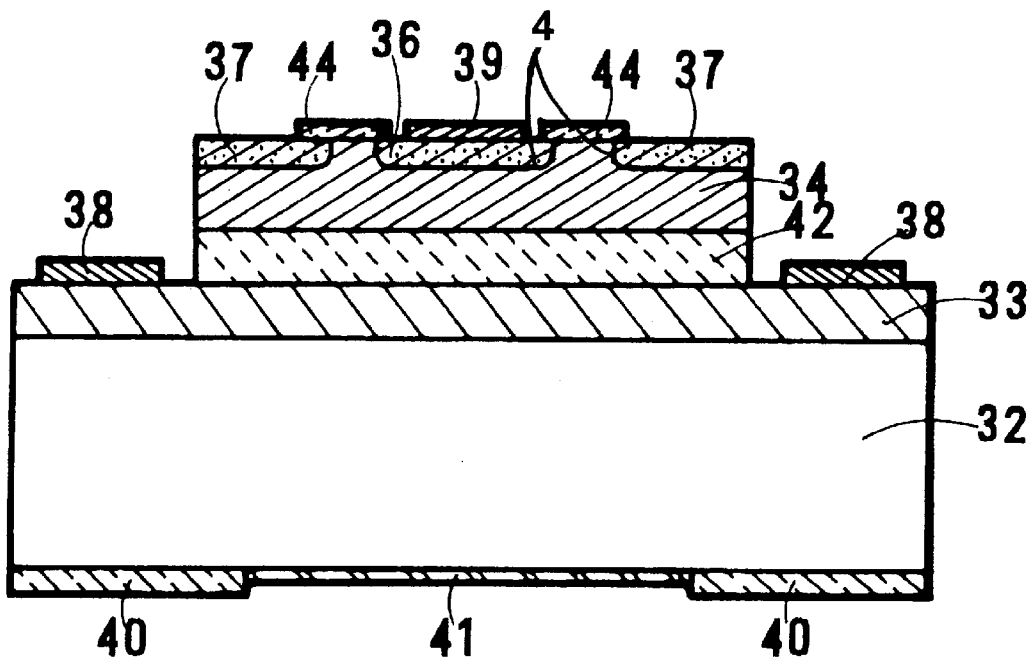
FIG. 9 is a longitudinal cross-sectional view of Example 2 of the present invention.

When a low dark-current is not always necessary, an example shown in FIG. 9 is possible. FIG. 9 is a longitudinal cross-sectional view of PD of Example 2. A similar structure of the PD as shown in FIG. 8 was provided, but an n-type-InP window layer 35 was omitted in this example. This PD was more simple and easier to make, because it had no window layer.

In FIG. 9, buffer layers 33 and 42, and an n-InGaAs photo-detecting layer 34 were epitaxially grown on an Fe-doped InP substrate 32 in that order. A conductive domain 36 in the center and a shield domain 37 in the peripheral area of the upper part of the photo-detecting layer 34, respectively, were formed by adding p-type dopants from a top surface of the PD and diffusing them. Since two pn-junctions 4 were exposed on the surface, side edges of the pn-junctions 4 were protected by a passivation film 44. The peripheral areas of the photo-detecting layer 34 and buffer layer 42 were removed by etching. Then the buffer layer 33 was exposed. A ring-shaped metallized film 40 and an AR-coating film 41 were formed on the bottom surface of the Fe-doped substrate 32, a p-electrode 39 was formed on the center of the top surface of the conductive domain 36, and an n-electrode 38 was formed on the low resistance (highly-doped) buffer layer 33.

EXAMPLE 3

Figure 10:
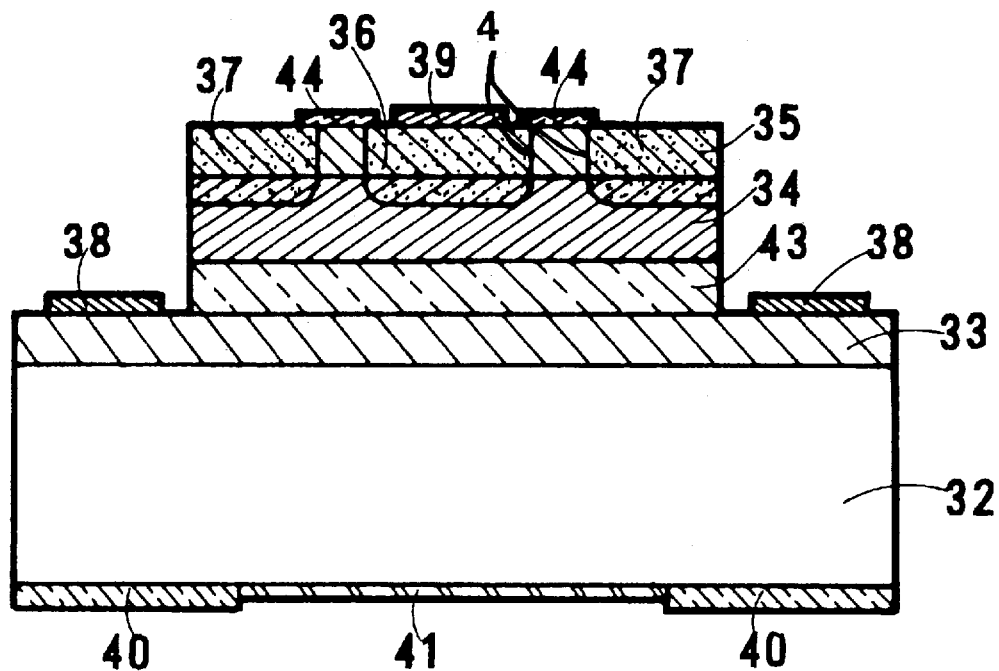
FIG. 10 is a longitudinal cross-sectional view of Example 3 of the present invention.

FIG. 10 shows a longitudinal cross-sectional view of Example 3 of the present invention. A less-doped InP buffer layer 43 of 2.5 μm thickness was formed on a highly-doped buffer layer 33. The less-doped buffer layer 43 prevented n-type dopants in the highly-doped buffer layer 33 from diffusing into the less-doped photo-detecting layer 34. The imposed less-doped buffer layer 43 increased forward-direction resistance; however, it prevented dopants such as sulfur in the highly doped and low resistant buffer layer 43 from diffusing by heat, etc. into the region of the less-doped InGaAs photo-detecting layer 34. In this Example, the imposed less-doped buffer layer having the carrier density not exceeding $10^{16}$ cm⁻³ could prevent dopants in the highly-doped buffer layer from diffusing into the region of the less-doped InGaAs photo-detecting layer 34. A less-doped buffer layer was imposed considering purity and lattice matching of each layer. Other constituents, such as pn-junctions 4, a substrate 32, a conductive domain 36, a shield domain 37, an n-type electrode 38, a p-type electrode 39, a metallized layer 40, an AR-coating film 41 and a passivation film 44 were the same as in Example 2.

EXAMPLE 4

Figure 11:
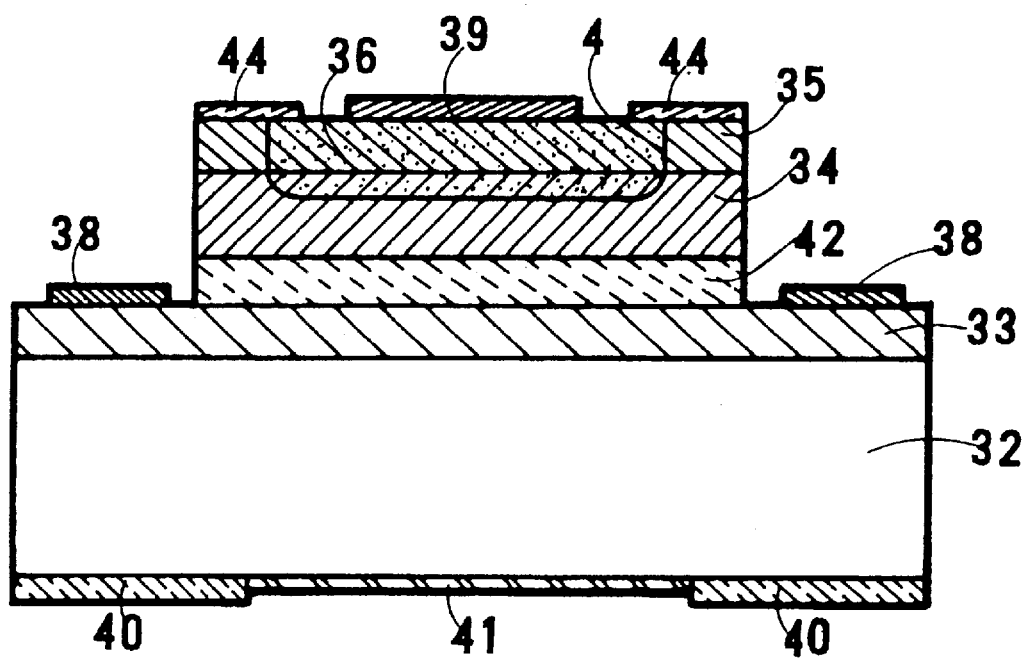
FIG. 11 is a longitudinal cross-sectional view of Example 4 of the present invention.

FIG. 11 shows a longitudinal cross-sectional view showing an Example 4 of the present invention. A shield domain is prepared for the purpose of preventing contribution of the light entering into the peripheral area of the window layer to a photocurrent by electron-hole recombination. Therefore, such shield domain is not always necessary when only the central area of a pn-junction is irradiated by the light.

A highly-doped $n^+$-InP buffer layer 33, a less-doped buffer layer 42, a less-doped $n^-$-InGaAs photo-detecting layer 34 and an n-InP window layer 35 were epitaxially grown on an Fe-dope InP substrate 32. A conductive domain 36 was formed only in the central portion of a top surface by means of Zn diffusion. No shield domain was formed in the peripheral area. A p-electrode 39 was formed on the conductive domain 36. A peripheral area of the window layer 35 and the photo-detecting layer 34 were removed by etching for exposing the highly doped buffer layer 33. The Buffer layers 33 and 42 may be same material not separated by the border phase of the cross section. In this case, even if there had been no shield domain, tail-shaped signals could be prevented by removing the peripheral area of the photo-detecting layer 34 to the area as near as possible to a pn-junction 4. Other constituents such as an n-electrode 38, a metallized layer 40, an AR-coating 41 and a passivation film 44 were the same as those in Example 2.

Although in the above Examples the PDs using InP- or InGaAs-PD were described, this invention is not limited to these PDs.

Depending on the optical wavelength, the material of InGaAsP can be used for a photo-detecting layer or buffer layer by changing its composition or in combination with InP. If InGaAsP, 4-elements material, is used for the photo-detecting layer, it can change a range of wavelength of light to be received. When InGaAsP is used for the buffer layer instead of InP, selectivity on the wavelength of light to be absorbed and transmitted can be made different from the case of InP.

EXAMPLE 5

Figure 12:
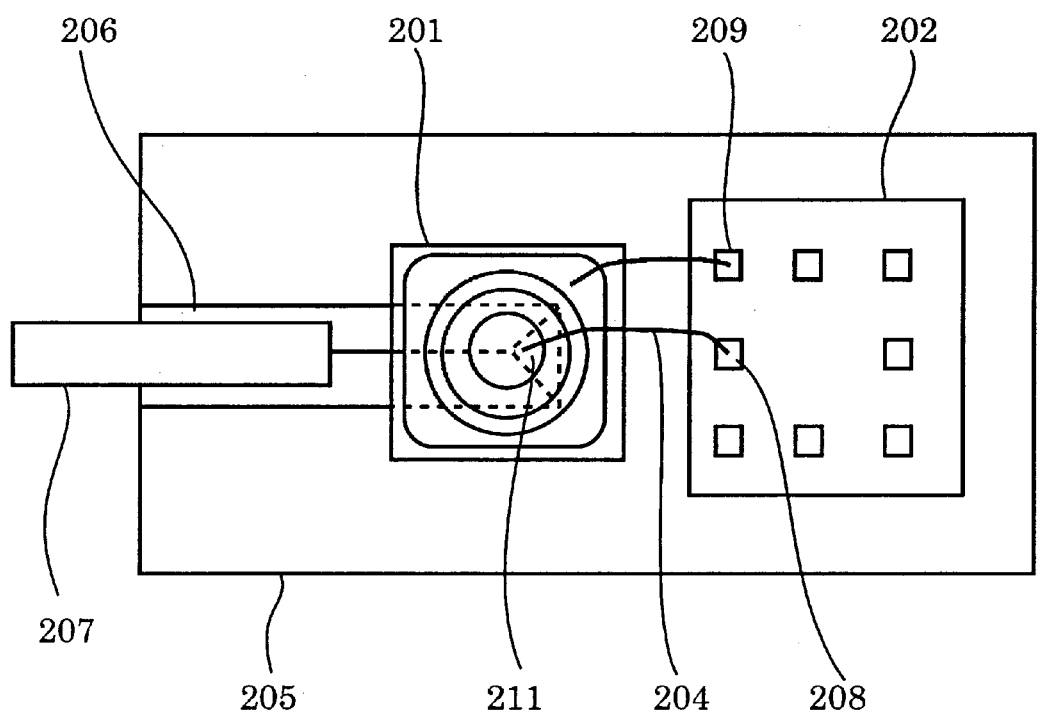
FIG. 12 is a plan view of an example of optical receiver using the PD of the present invention.

As these PDs of the present invention are suitable for being placed very close to electrical-signal amplifiers such as Si-IC and GaAs-IC, they can operate as high sensitivity PDs. FIG. 12 is a plan view of Example 5 that is an example of a semiconductor optical receiver using a PD of the present invention. A V-groove 206 and a mirror 211 are formed on an Si-substrate 205, and an optical fiber 207 is fixed on the V groove 206. A PD 201 of the present invention is placed nearby the mirror 211 to receive the signal light properly. In the neighborhood of the PD 201, an electrical-signal amplifier 202 using an Si-IC is placed. Both p-electrode 208 and n-electrode 209 of the amplifier 202 can be connected in a short distance directly with the Si-IC electrodes for the PD 201 by an Au wire 204, for example. As a result, a high-sensitivity semiconductor optical receiver that is less affected by surrounding noise can be obtained.

The present invention is not limited to the above examples, and the scope of the present invention shall be defined by the claims.

What is claimed is:

1. A semiconductor photodiode for receiving optical signals from the bottom surface thereof and converting the same to electrical signals comprising:
   an insulating or a semi-insulating substrate;
   a highly-doped buffer layer of a first conductive type that is formed directly on the substrate;
   a photo-detecting layer of said first conductive type that is formed on the highly-doped buffer layer;
   a conductive domain of a second conductive type that is partly formed in the photo-detecting layer extending from a top surface to an inner part thereof, wherein the conductive domain is surrounded by the photo-detecting layer except at the top surface;
   a pn-junction that is formed along a boundary between the conductive domain and the photo-detecting layer;
   a first electrode that is formed on the conductive domain; and
   a second electrode that is formed on an exposed surface of the highly-doped buffer layer, wherein the exposed surface is opposite to a surface attached to the substrate, by removing a peripheral area of the conductive domain from the top surface of the photo-detecting layer to the highly-doped buffer layer.

2. A semiconductor photodiode according to claim 1, wherein:
   the substrate is made of Fe-doped InP,
   the highly-doped buffer layer is made of $n^+$-InP,
   the photo-detecting layer is made of n-InGaAs or n-InGaAsP,
   the conductive domain is formed by zinc diffusion,
   a p-electrode is formed as the first electrode, and
   an n-electrode is formed as the second electrode.

3. A semiconductor photodiode according to claim 2, wherein:
   an Fe density of the substrate is not less than $10^{16}$ and not more than $10^{19}$ cm$^{-3}$,
   a carrier density of the highly-doped buffer layer is not less than $10^{17}$ and not more than $10^{19}$ cm$^{-3}$,
   a carrier density of the photo-detecting layer is not exceeding $5 \times 10^{15}$ cm$^{-3}$, and
   a carrier density of the conductive domain is not less than $3 \times 10^{18}$ and not more than $10^{19}$ cm$^{-3}$.

4. A semiconductor photodiode according to claim 1, further comprising a less-doped buffer layer that is inserted between the highly-doped buffer layer and the photo-detecting layer.

5. A semiconductor photodiode according to claim 4, wherein the less-doped buffer layer is made of n-InP.

6. A semiconductor photodiode according to claim 5, wherein a carrier density of the less-doped buffer layer is not exceeding $1 \times 10^{16}$ cm$^{-3}$.

7. A semiconductor photodiode according to claim 1, further comprising:
   a shield domain that is formed in a peripheral area around the conductive domain extending from the top surface to the photo-detecting layer, and
   a part of the shield domain is removed from the top surface of the photo-detecting layer to the highly-doped buffer layer except for a neighboring area of the conductive domain.

8. A semiconductor photodiode according to claim 7, wherein:
   the shield domain is formed by zinc diffusion.

9. A semiconductor photodiode according to claim 8, wherein:
   a carrier density of the shield domain is not less than $3 \times 10^{18}$ and not more than $10^{19}$ cm$^{-3}$.

10. A semiconductor photodiode for receiving optical signals from the bottom surface thereof and converting such signals into electrical signals comprising:
    an insulating or a semi-insulating substrate;
    a highly-doped buffer layer of a first conductive type that is formed directly on the substrate;
    a photo-detecting layer of said first conductive type that is formed on the highly-doped buffer layer;
    a window layer that is formed on the photo-detecting layer;

a conductive domain of a second conductive type that is partly formed in the window layer extending from a top surface to the photo-detecting layer, wherein the conductive domain is surrounded by the photo-detecting layer and the window layer except at the top surface;

a pn-junction that is formed along a boundary between the conductive domain and the photo-detecting layer and the window layer;

a first electrode that is formed on the conductive domain; and a second electrode that is formed on an exposed surface of the highly-doped buffer layer, wherein the exposed surface is opposite to a surface attached to the substrate, by removing a peripheral area around the conductive domain from the top surface of the window layer to the highly-doped buffer layer.

11. A semiconductor photodiode according to claim 10, wherein:

the substrate is made of Fe-doped InP, the highly-doped buffer layer is made of $n^+$-InP, the photo-detecting layer is made of n-InGaAs or n-InGaAsP, the window layer is made of n-InP, the conductive domain is formed by zinc diffusion, a p-electrode is formed as the first electrode, and an n-electrode is formed as the second electrode.

12. A semiconductor photodiode according to claim 11, wherein:

an Fe density of the substrate is not less than $10^{16}$ and not more than $10^{19}$ cm$^{-3}$;

a carrier density of the highly-doped buffer layer is not less than $10^{17}$ to not more than $10^{19}$ cm$^{-3}$;

a carrier density of the photo-detecting layer is not exceeding $5\times10^{15}$ cm$^{-3}$;

a carrier density of the window layer is not less than $10^{15}$ and not more than $5\times10^{15}$ cm$^{-3}$, and a carrier density of the conductive domain is not less than $3\times10^{18}$ and not more than $10^{19}$ cm$^{-3}$.

13. A semiconductor photodiode according to claim 8, further comprising a less-doped buffer layer that is inserted between the highly-doped buffer layer and the photo-detecting layer.

14. A semiconductor photodiode according to claim 13, wherein the less-doped buffer layer is made of n-InP.

15. A semiconductor photodiode according to claim 10, further comprising:

a shield domain that is formed in a peripheral area around the conductive domain extending from the top surface to the photo-detecting layer, and a part of the shield domain is removed from the top surface of the highly-doped buffer layer except for a neighboring area of the conductive domain.

16. A semiconductor photodiode according to claim 15, wherein:

the shield domain is formed by zinc diffusion.

17. A semiconductor photodiode for receiving optical signals from the bottom surface thereof and converting the same to electric signals comprising:

an insulating or a semi-insulating substrate;

a highly-doped buffer layer of a first conductive type that is formed directly on the substrate;

a photo-detecting layer of said first conductive type that is formed on the buffer layer;

a window layer that is formed on the photo-detecting layer;

a conductive domain of a second conductive type that is partly formed in the window layer extending from a top surface to the photo-detecting layer, wherein the conductive domain is surrounded by the photo-detecting layer except at the top surface;

a pn-junction that is formed along a boundary between the conductive domain and the photo-detecting layer;

a first electrode that is formed on the conductive domain;

a shield domain that is formed in a peripheral area around the conductive domain extending from the top surface to the photo-detecting layer; and a part of the shield domain is removed from the top surface of the photo-detecting layer to the highly-doped buffer layer except for a neighboring area of the conductive domain; and a second electrode is formed on an exposed surface of the highly-doped buffer layer, wherein the exposed surface is opposite to a surface attached to the substrate, by removing a peripheral area around the conductive domain from the top surface to the highly-doped buffer layer;

wherein the substrate is made of Fe-doped InP, the highly-doped buffer layer is made of $n^+$-InP, the photo-detecting layer is made of n-InGaAs or n-InGaAsP, the window layer is made of n-InP, the conductive and the shield domains are formed by zinc diffusion, the first electrode is a p-electrode, the second electrode is an n-electrode; and wherein an Fe-density of the Fe-doped InP substrate is not less than $10^{16}$ and not more than $10^{19}$ cm$^{-3}$, a carrier density of the highly-doped buffer layer is not less than $10^{17}$ and not more than $10^{19}$ cm$^{-3}$, a carrier density of the photo-detecting layer is not exceeding $5\times10^{15}$ cm$^{-3}$, a carrier density of the window layer is not less than $10^{15}$ and not more than $5\times10^{15}$ cm$^{-3}$, and each carrier density of the conductive domain and the shield domain is not less than $3\times10^{18}$ and not more than $10^{19}$ cm$^{-3}$.

18. A semiconductor optical receiver comprising an electrical-signal amplifier that is combined with the semiconductor photodiode according to claim 1.

19. A semiconductor optical receiver according to claim 18 comprising an optical fiber, an electrical-signal amplifier and the semiconductor photodiode that are placed on an Si-substrate.

* * * * *